United States Patent
Wang et al.

(10) Patent No.: US 10,247,775 B2
(45) Date of Patent: Apr. 2, 2019

(54) LENGTH ADJUSTABLE ARM AND MEMS POSITION DETECTION EQUIPMENT ROTATION TEST APPARATUS

(71) Applicant: LEAP ELECTRONIC CO., LTD., New Taipei (TW)

(72) Inventors: An-Sung Wang, New Taipei (TW); Ching-Chang Wong, New Taipei (TW); Yang-Han Lee, New Taipei (TW)

(73) Assignee: LEAP ELECTRONIC CO., LTD., New Taipei (TW)

(*) Notice: Subject to any disclaimer, the term of this patent is extended or adjusted under 35 U.S.C. 154(b) by 59 days.

(21) Appl. No.: 15/486,287

(22) Filed: Apr. 12, 2017

(65) Prior Publication Data
US 2018/0299505 A1    Oct. 18, 2018

(51) Int. Cl.
*G01R 31/28* (2006.01)
*B65G 47/91* (2006.01)

(52) U.S. Cl.
CPC ....... *G01R 31/2893* (2013.01); *B65G 47/914* (2013.01); *G01R 31/2875* (2013.01)

(58) Field of Classification Search
CPC ............ G01R 31/2856; G01R 31/2875; G01R 31/2877
See application file for complete search history.

(56) References Cited

U.S. PATENT DOCUMENTS

| | | | | |
|---|---|---|---|---|
| 5,198,752 A | * | 3/1993 | Miyata | G01R 1/07314 165/80.4 |
| 2002/0109518 A1 | * | 8/2002 | Saito | G01R 1/0458 324/750.09 |

\* cited by examiner

*Primary Examiner* — Tung X Nguyen
(74) *Attorney, Agent, or Firm* — Leong C. Lei

(57) ABSTRACT

A length adjustable arm and MEMS position detection equipment rotation test apparatus includes an extendible section and first and second rotary bodies provided at one end of a rotation device for variation of a feeding position of a first feeding component so that feeding component is capable of conducting various feeding ways. Further, a worktable is provided thereon with at least one rotation section, which has a surface on which a plurality of operation stations is mounted. As such, through circular change made by the rotation section in respect of the locations of the operation stations, an effect of effectively and efficiently burning or testing can be achieved. Further, the operation stations are provided, on a periphery thereof, with a turning section, and the turning section is operable to turn each of the operation stations in order to effectively conduct tests for various MEMS inertial components.

21 Claims, 10 Drawing Sheets

LENGTH ADJUSTABLE ARM AND MEMS POSITION DETECTION EQUIPMENT ROTATION TEST APPARATUS

CROSS-REFERENCES TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

BACKGROUND OF THE INVENTION (a) Field of the Invention

The present invention relates generally to a length adjustable arm and MEMS position detection equipment rotation test apparatus, and more particularly to a test apparatus that comprises an extendible section, a first rotary body and a second rotary body or a third rotary body and a fourth rotary body for effective variation of a feeding position of a first feeding component or a second feeding component and a rotation section for selective variation of a position of each of operation stations and also comprises a turning section to turn the operation stations in order to facilitate test and inspection of various inertial elements of micro-electromechanical system (MEMS).

(b) Description of the Related Art Including Information Disclosed Under 37 CFR 1.97 and CFR 1.98

In burning or programming integrated circuits (ICs), it needs to first move an un-burnt IC to a loading section by using a feeding section and then, the un-burnt IC that is located in the loading section is moved by means of a feeding suction nozzle provided at one end of a rotary arm to a operation station to proceed with a burning operation. After the IC has been burnt, a feeding suction nozzle provided on the end or an opposite end of the rotary arm is moved to the operation station to pick up and move the IC that has been burnt from the operation station to the feeding section. This process is cyclically and repeatedly conducted to complete the burning operation for ICs.

However, the rotary arm is imposed with an operation path that allows for operation to be conducted along a circular route. This makes it necessary for the operation station to be arranged on the circular route of the rotary arm in order to proceed an effective burning operation on the ICs.

Further, both burnt ICs and un-burnet ICs are both moved by means of the feeding suction nozzle(s) provided on the rotary arm. In a case that one IC that is located at a proximal site and one IC that is located at a remote site are both finished with the burning operation at the same time, then the rotary arm must first moved to the proximal site and then to the remote site to complete the feeding operation. This operation, which is one that has slow operation efficiency, definitely leads to a waste of time.

In view of the above drawbacks, the present invention aims to provide a length adjustable arm and MEMS position detection equipment rotation test apparatus, which helps improve operation efficiency, saves cost, and achieves effective test and inspection of performance of MEMS related components/parts so as to alleviate or eliminate the drawbacks of the prior art and thus improve utilization performance thereof.

BRIEF SUMMARY OF THE INVENTION

To achieve the objective, the present invention provides a length adjustable arm and MEMS position detection equipment rotation test apparatus, which comprises:

a feeding section, wherein the feeding section comprises a feeding component that is operable to convey an un-burnt IC into a loading section;

a rotation device, wherein the rotation device has one end coupled to a first feeding component, the first feeding component being operable for upward/downward/leftward/rightward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and a plurality of operation stations, wherein the operation stations are arranged on a circumferential area of and adjacent to the rotation device, the operation stations having a surface that is provided with an operation section, so that when the first part feeding component sucks and picks up the un-burnt IC located in the loading section, the rotation device moves the first part feeding component to a location adjacent to the operation stations, and then, the first rotary body and the second rotary body are operable to adjust the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

In the above-described rotation device, the rotation device is further provided, on said one end thereof, with a first rotary body, the first rotary body having an opposite end rotatably coupled to a second rotary body, the second rotary body having an opposite end coupled to the first feeding component, and the rotation device comprises a drive source that comprises a hollow motor operatively coupled with a hollow type speed reducer.

In the above-described rotation device, the rotation device has an opposite end that is provided with a third rotary body, the third rotary body having an opposite end rotatably coupled to a fourth rotary body, the fourth rotary body having an opposite end coupled to a second feeding component, the second feeding component being operable for upward/downward/leftward/rightward movement and rotary motion so that when the first feeding component carries out a feeding or part conveying operation, the second feeding component is operable to simultaneously carry out a feeding or out-feeding operation.

In the above-described rotation device, the rotation device is provided, on a periphery thereof, with a waste zone to receive and hold an un-burnable IC or a damaged IC.

In the above-described first feeding component, the first feeding component and the second feeding component suck and pick up an IC through vacuum suction.

In the above-described loading section, the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

To achieve the objective, the present invention provides another length adjustable arm and MEMS position detection equipment rotation test apparatus, which comprises:

a feeding section, wherein the feeding section comprises a feeding component that is operable to convey an un-burnt IC into a loading section;

a rotation device, wherein the rotation device is provided therein with a first extendible section; the first extendible section is coupled to a first feeding component to control a frontward/rearward position of the first feeding component; the first feeding component is operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and a plurality of operation stations, wherein the operation stations are arranged on a circumferential area of and adjacent to the rotation device, the operation stations having a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

In the above-described rotation device, the rotation device is provided therein with a second extendible section; the second extendible section is coupled to a second feeding component to control a frontward/rearward position of the second feeding component and the second feeding component is operable for upward/downward and rotary motion so that when the first feeding component carries out a feeding or part conveying operation, the second feeding component is operable to simultaneously carry out a feeding or out-feeding operation; and the rotation device comprises a drive source that comprises a hollow motor operatively coupled with a hollow type speed reducer.

In the above-described first feeding component, the first feeding component and the second feeding component suck and pick up an IC through vacuum suction.

In the above-described first extendible section, the first extendible section and the second extendible section are driven through belt driving, screw driving, or frog-arm driving.

In the above-described loading section, the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

To achieve the objective, the present invention provides a further length adjustable arm and MEMS position detection equipment rotation test apparatus, which comprises:

a feeding section, wherein the feeding section comprises a feeding component that is operable to convey an un-burnt IC into a loading section;

a rotation device, wherein the rotation device has one end coupled to a first feeding component, the first feeding component being operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and a plurality of operation stations, wherein the operation stations are arranged on a circumferential area of and adjacent to the rotation device; the operation stations are mounted on a rotation section; the rotation section is operable for rotation clockwise or counterclockwise in order to drive the operation stations to change positions thereof; and the operation stations have a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

In the above-described rotation device, the rotation device has an opposite end that is coupled to a second feeding component, the second feeding component being operable for upward/downward movement and rotary motion so that when the first feeding component carries out a feeding or part conveying operation, the second feeding component is operable to simultaneously carry out a feeding or out-feeding operation; and the rotation device comprises a drive source that comprises a hollow motor operatively coupled with a hollow type speed reducer.

In the above-described first feeding component, the first feeding component and the second feeding component suck and pick up an IC through vacuum suction.

In the above-described rotation device, the rotation section is further operable for test of an MEMS inertial object or non-inertial object.

In the above-described loading section, the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

To achieve the objective, the present invention provides a further length adjustable arm and MEMS position detection equipment rotation test apparatus, which comprises:

a feeding section, wherein the feeding section comprises a feeding component that is operable to convey an un-burnt IC into a loading section;

a rotation device, wherein the rotation device has one end coupled to a first feeding component, the first feeding component being operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and a plurality of operation stations, wherein the operation stations are arranged on a circumferential area of and adjacent to the rotation device; the operation stations are provided on a periphery thereof with a turning section and the turning section is operable to drive the operation stations to conduct an operation of turning; and the operation stations have a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

In the above-described rotation device, the rotation device has an opposite end that is coupled to a second feeding component, the second feeding component being operable for upward/downward movement and rotary motion so that when the first feeding component carries out a feeding or part conveying operation, the second feeding component is operable to simultaneously carry out a feeding or out-feeding operation; and the rotation device comprises a drive source that comprises a hollow motor operatively coupled with a hollow type speed reducer.

In the above-described first feeding component, the first feeding component and the second feeding component suck and pick up an IC through vacuum suction.

In the above-described rotation device, the rotation device is further provided, at a central position, with a test subject placing device; the test subject placing device is set at a location that is higher than or lower than the rotation device; and the test subject placing device has an end to which a placing component is mounted and coupling to a test component is made through the placing component.

In the above-described loading section, the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE INVENTION

Figure 1:
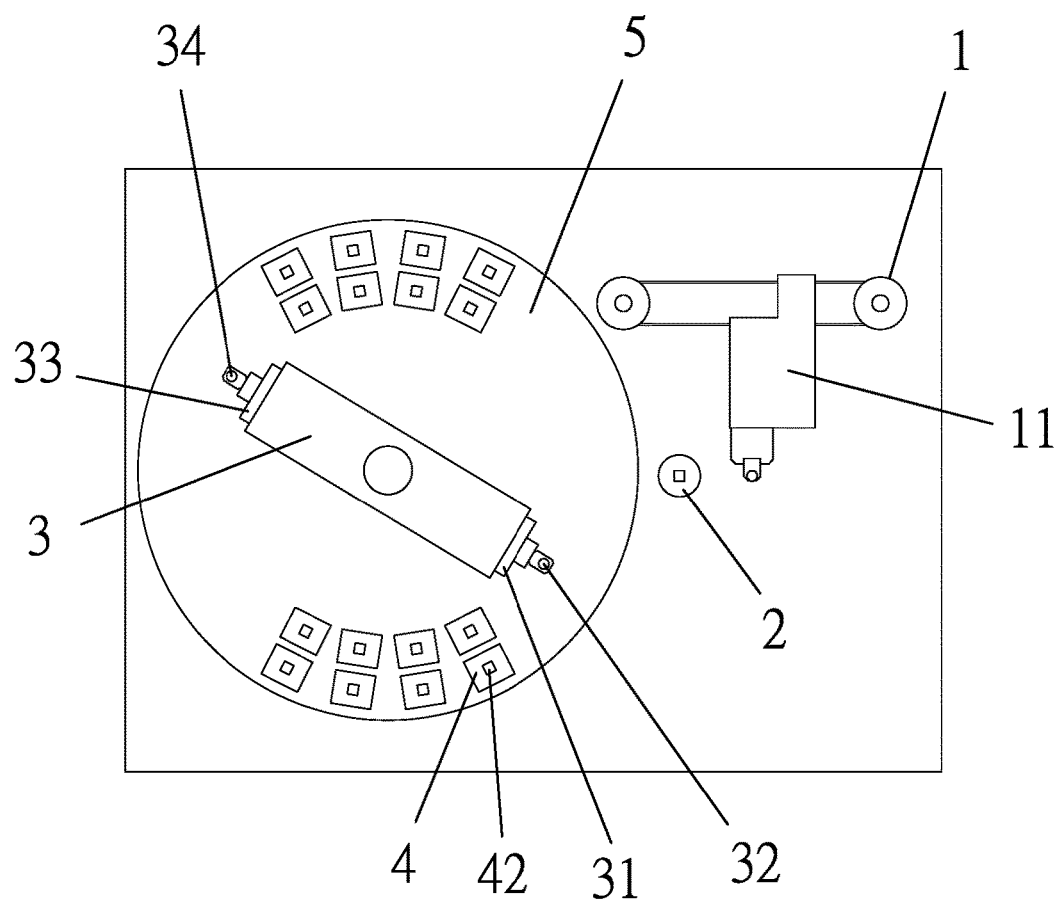
FIG. 1 is a schematic view showing a structure of the present invention

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to FIGS. 1-5, which are respectively a schematic view showing a structure of the present invention and a schematic view illustrating operation of a turning section according to the present invention, as shown in the drawings, the present invention generally comprises a feeding section 1, wherein the feeding section 1 comprises a feeding component 11 that conveys an un-burnt integrated circuit (IC) to a loading section 2;

a rotation device 3, wherein the rotation device 3 is provided therein with a first extendible section 31; the first extendible section 31 is coupled to a first feeding component 32 to control a frontward/rearward position of the first feeding component 32; the first feeding component 32 is operable for upward/downward/leftward/rightward movement and rotary motion so that when the first feeding component 32 is moved to a location above the loading section 2, the first feeding component 32 carries out an operation of downward movement to suck and pick up an un-burnt IC located in the loading section 2 and then carries out an operation of upward movement to move the un-burnt IC; and a plurality of operation stations 4, wherein the operation stations 4 are arranged on a circumferential area of and adjacent to the rotation device 3; the operation stations 4 are mounted on a rotation section 5; the rotation section 5 is operable for rotation clockwise or counterclockwise in order to drive the operation stations 4 to change positions thereof and the rotation section is also operable for test of MEMS inertial objects or non-inertial objects; the operation sections 4 are provided on a periphery thereof with a turning section 41 and the turning section 41 is operable to drive the operation stations 4 to conduct an operation of turning; the operation stations 4 have a surface that is provided with an operation section 42, so that when the first part feeding component 32 sucks and picks up the un-burnt IC located in the loading section 2, the rotation device 3 moves the first part feeding component 32 to a location adjacent to the operation stations 4 and determines if it is necessary to drive the first extendible section 31 to conduct adjustment of position of the first part feeding component 32 in order to place the un-burnt IC into the operation section 42 for burning and when the burning of IC is completed, the first part feeding component 32 moves the burnt IC from the operation section 42 to an out-feeding section, wherein a process of feeding, burning, and out-feeding is cyclically and repeatedly performed.

In the above-described rotation device 3, the rotation device 3 is provided therein with a second extendible section 33, wherein the second extendible section 33 is coupled to a second feeding component 34 to control a frontward/rearward position of the second feeding component 34 and the second feeding component 34 is operable for upward/downward/leftward/rightward movement and rotary motion so that when the first feeding component 32 carries out a feeding or part conveying operation, the second feeding component 34 is operable to simultaneously carry out a feeding or out-feeding operation.

In the above-described first extendible section 31, the first extendible section 31 and the second extendible section 33 are driven through belt driving, screw driving, or frog-arm driving.

In the above-described rotation device 3, the rotation device 3 is provided, on a periphery thereof, with a waste zone to receive and hold un-burnable ICs or damaged ICs.

In the above-described first feeding component 32, the first feeding component 32 and the second feeding component 34 suck and pick up ICs through vacuum suction.

In the above-described loading section 2, the loading section 2 is further provided with a holding component (not shown), wherein the holding component comprises a cavity (not shown), and the cavity corresponds to and receives and holds an IC to be burnt and to be tested to correct a posture of the IC to be burnt or to be tested and the holding component is operable to rotate in order to be aligned to various feeding directions.

Figure 2:
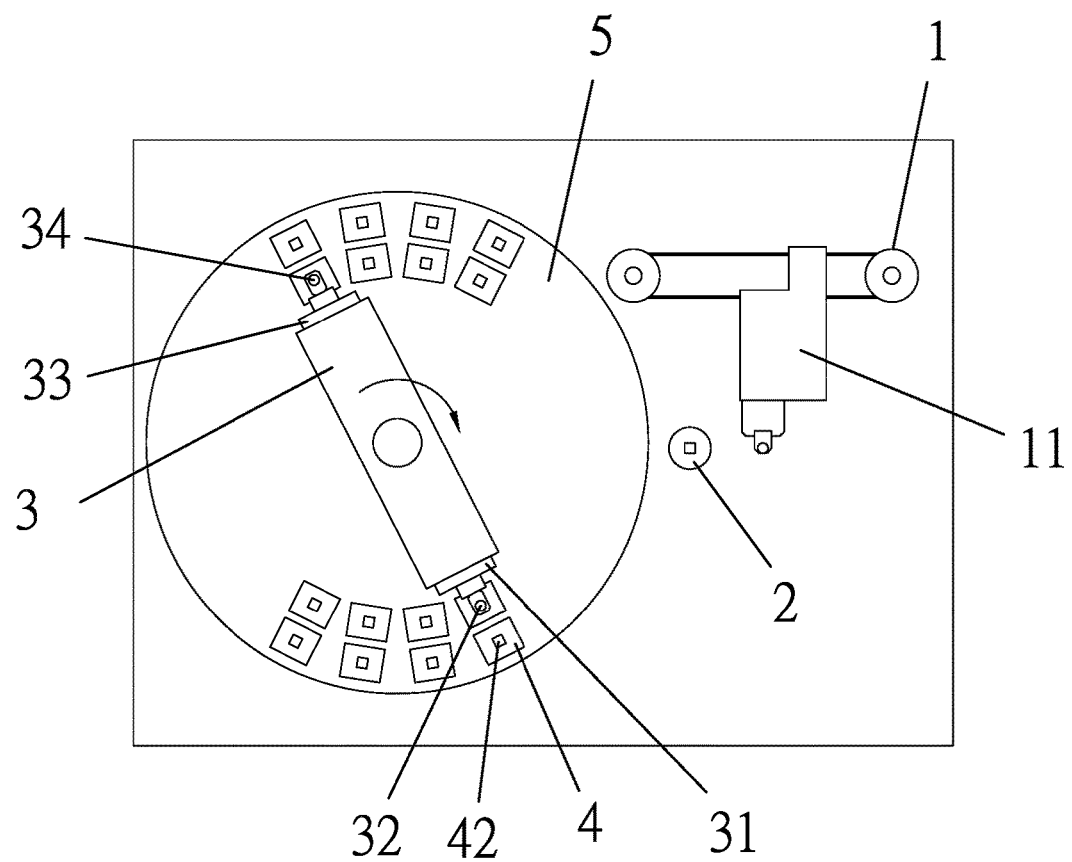
FIG. 2 is a schematic view illustrating operation of a rotation device of the present invention.
Figure 3:
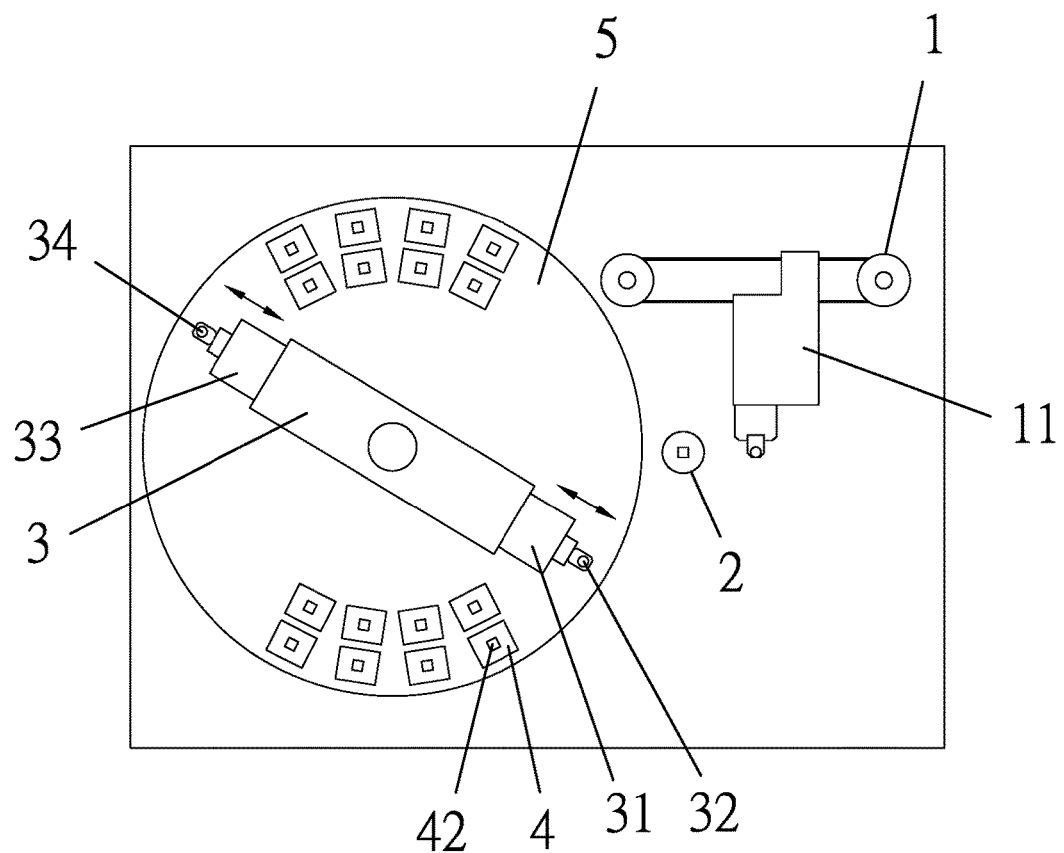
FIG. 3 is a schematic view illustrating operation of an extendible structure of the present invention.
Figure 4:
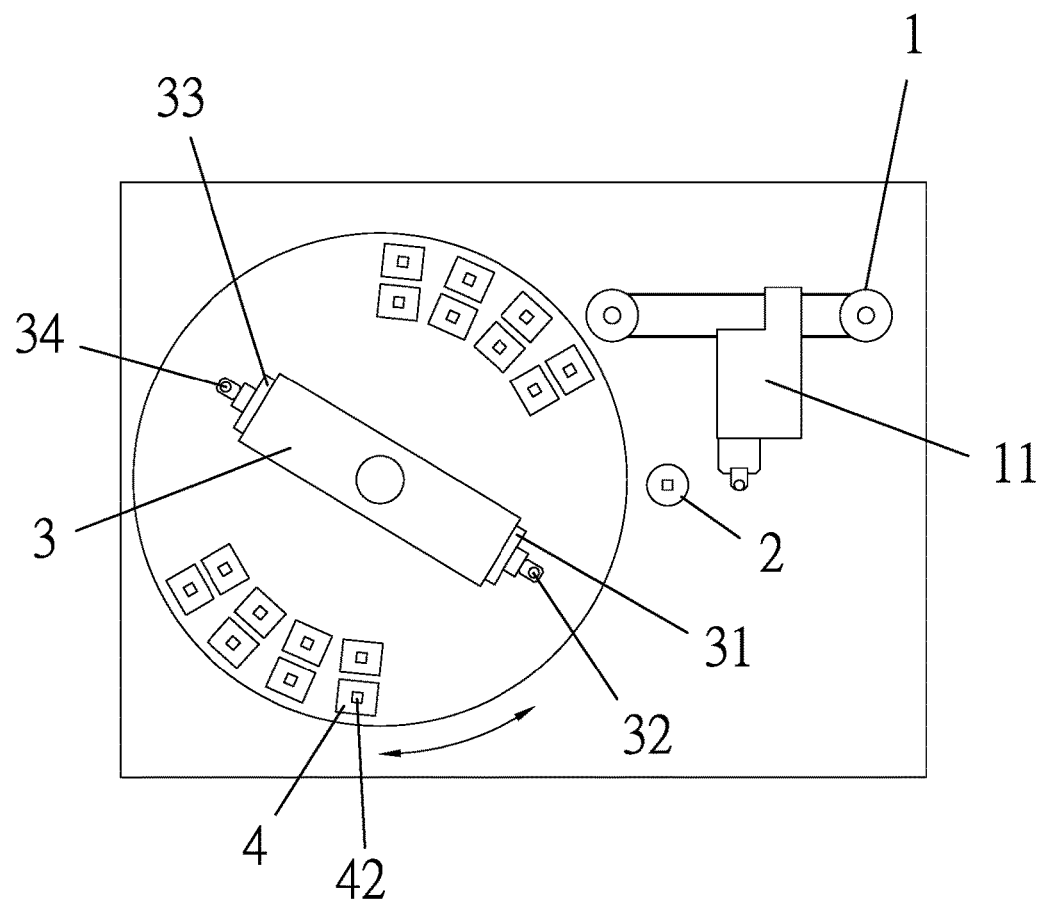
FIG. 4 is a schematic view illustrating operation of a rotation section of the present invention.

Referring to FIGS. 2-4, which are respectively a schematic view illustrating operation of a rotation device of the present invention and a schematic view illustrating operation of an extendible structure of the present invention, as shown in the drawings, the rotation device 3 is operable for rotation motion in a clockwise direction or a counterclockwise direction so that when the first feeding component 32 or the second feeding component 34 sucks and picks up an un-burnt IC from the loading section 2, the rotation device 3 rotatably moves the first feeding component 32 or the second feeding component 34 to one of the operation stations 4 that is not performing a burning operation and causes the first feeding component 32 or the second feeding component 34 to move downward to place the un-burnt IC in the operation station 4 for carrying out a burning operation. However, to increase the number of the operation stations 4 in order to achieve an effect of more effectively and more efficiently carrying out burning operations, the operation stations 4 are arranged to expand, in a circular form, to surround, and be located adjacent to, the peripheral area of the rotation device 3 so that the ones of the operation stations 4 that are proximal to the rotation device 3 or the ones of the operation stations 4 that are distant from the rotation device 3 are both capable of effectively carrying out burning operations. In order to achieve the purpose of expanding operation stations, the rotation device 3 is provided therein with a first extendible section 31 and a second extendible section 33, wherein the first extendible section 31 is coupled to the first feeding component 32 and the second extendible section 33 is coupled to the second feeding component 34 so that the first feeding component 32 or the second feeding component 34 is allowed for movement of extension/retraction by means of the first extendible section 31 or the second extendible section 33 and therefore, when the first feeding component 32 or the second feeding component 34 sucks and picks up an un-burnt IC from the loading section 2, the rotation device 3 first rotatably moves the first feeding component 32 or the second feeding component 34 to a position corresponding to one of the operation stations 4 that is not set in a burning operation. If the one of the operation stations 4 that is not in burning operation is at a remote site, then the first extendible section 31 or the second extendible section 33 is caused to extend and thus project the first feeding component 32 or the second feeding component 34 out to the position of the one of the operation stations 4 that is not in burning operation in order to allow the first feeding component 32 or the second feeding component 34 to place the un-burnt IC in the one of the operation stations 4 that is not in burning operation for performance of a burning operation thereafter; and oppositely, if the one of the operation stations 4 that is not in burning operation is at a proximal site, then the first extendible section 31 or the second extendible section 33 is caused to retract to draw the first feeding component 32 or the second feeding component 34 inward to a position corresponding to the one of the operation stations 4 that is not in burning operation in order to allow the first feeding component 32 or the second feeding component 34 to place the un-burnt IC in the one of the operation stations 4 that is not in burning operation for performance of a burning operation thereafter; further, when the one of the operation stations 4 have completely carried out the burning operation, the first feeding component 32 or the second feeding component 34 is allowed to move, in the same way as described above, to a location above the one of the operation stations 4 and the first feeding component 32 or the second part feeding component 34 is then caused to carry out a downward movement to suck and pick up the burnt IC for conveying the burnt IC to the out-feeding zone.

Figure 5:
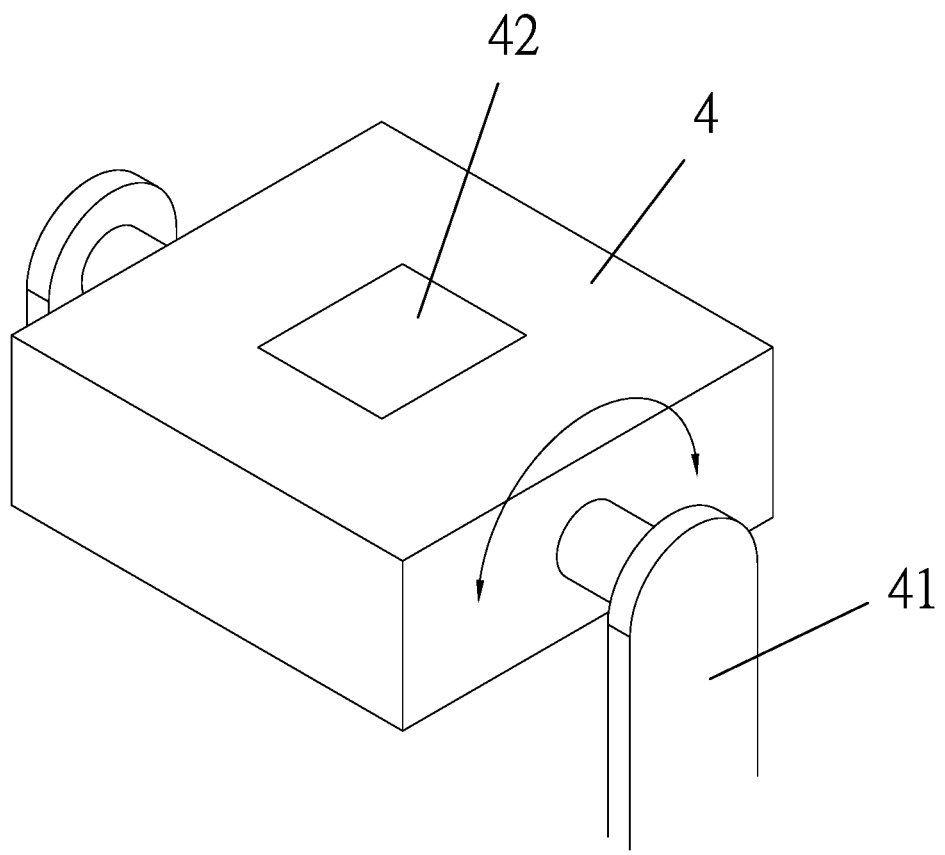
FIG. 5 is a schematic view illustrating operation of a turning section of the present invention.

Referring to FIGS. 4 and 5, Which are respectively a schematic view illustrating operation of a rotation section of the present invention and a schematic view illustrating operation of a turning section of the present invention, as shown in the drawings, each of the operation stations 4 is mounted on the rotation section 5 and the rotation section 5 is operable for rotation clockwise or counterclockwise, and also, the rotation section 5 is operable for test of MEMS inertial objects or non-inertial objects so that when the first feeding component 32 or the second feeding component 34 sucks and picks up an un-burnt IC, in addition to rotation of the first feeding component 32 or the second feeding component 34 of the rotation device 3 to reach a location above one of the operation stations 4 that is not in burning operation, it is also possible to use the rotation section 5 to rotatably move the one of the operation stations 4 that is not in burning operation to a location adjacent to the first feeding component 32 or the second feeding component 34 to allow the first feeding component 32 or the second feeding component 34 to fast place the un-burnt IC into the one of the operation stations 4 that is not in burning operation; and oppositely, after the operation station 4 has completely carried out the burning operation, the rotation section 5 is also operable to rotatably move the operation station 4 to a location adjacent to the first feeding component 32 or the second feeding component 34 to allow for fast removal and conveyance of the burnt IC to the out-feeding zone.

Further, the present invention is also applicable to test of MEMS inertial components, such as G-sensor and gyro. The first feeding component 32 or the second feeding component 34 is first operable to move an inertial component into the operation stations 4 and then, the rotation section 5 is operable to move each of the operation stations 4, and also, the rotation section 5 is operable to test of the MEMS inertial objects or non-inertial objects by having a rotational speed induced in the rotation section 5 to conduct the test of the inertial component. Further, the operation stations 4 are provided on a periphery thereof with a turning section 41 and the turning section 41 is operable to drive the operation stations 4 to conduct an operation of turning so that when the inertial component is placed in the operation sections 42, the turning section 41 may be operated to turn the operation stations 4, in order to vary the test of the inertial component at different angles thereby achieving an effect of effectively testing an MEMS inertial component.

Figure 6:
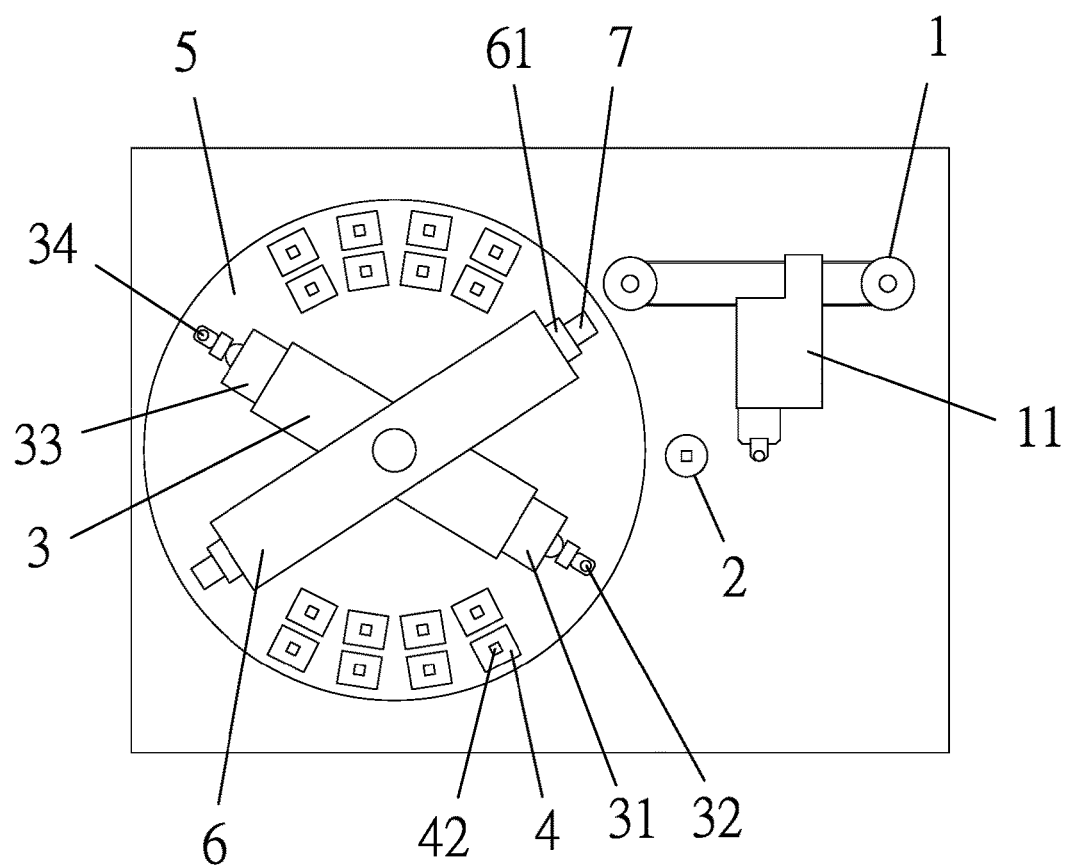
FIG. 6 is a schematic view illustrating an embodiment of a test subject placing device of the present invention.
Figure 7:
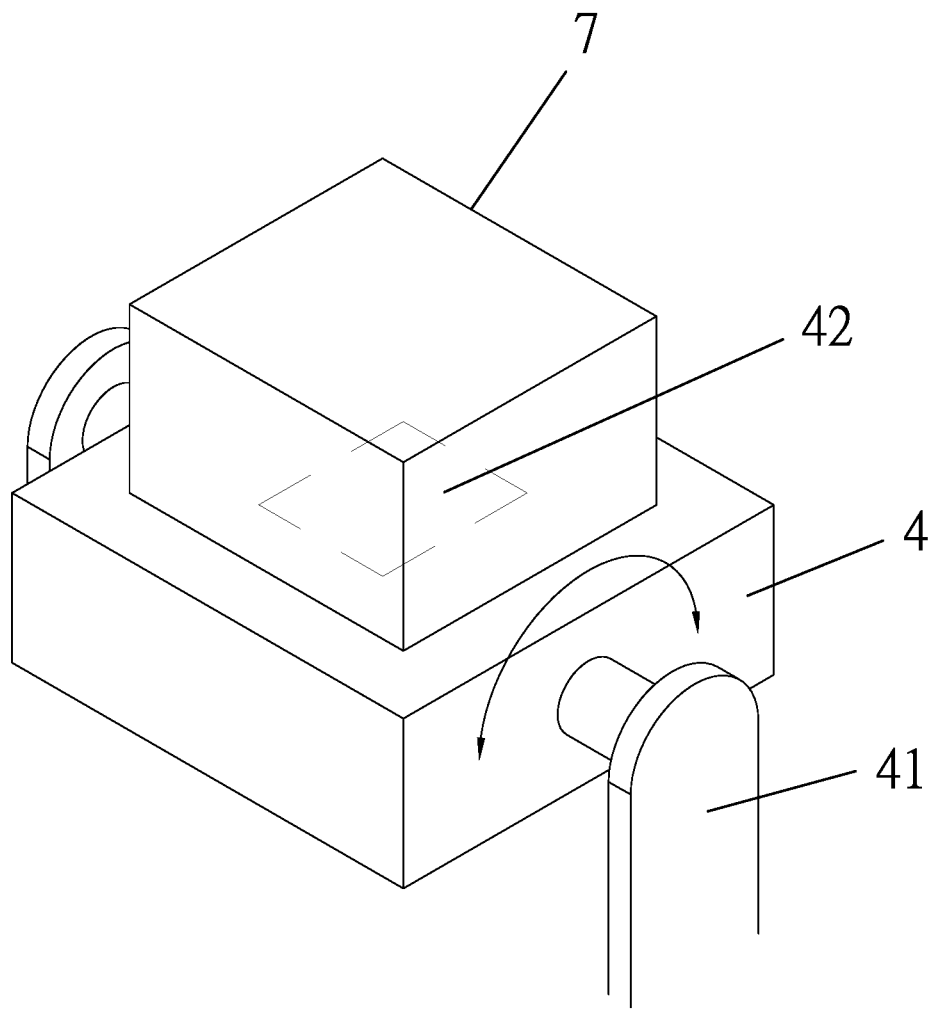
FIG. 7 is a schematic view illustrating test of a MEMS non-inertial element according to the present invention.
Figure 8:
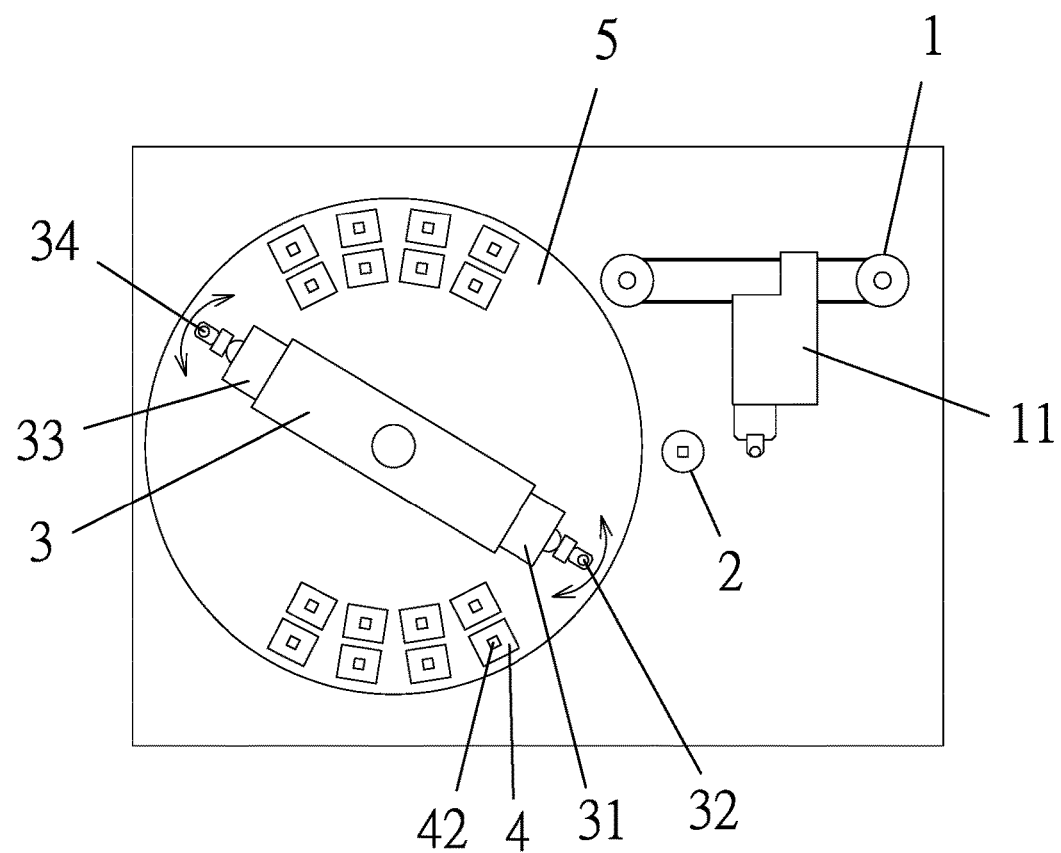
FIG. 8 is a schematic view illustrating leftward/rightward movement of a first feeding component and a second feeding component of the present invention.
Figure 9:
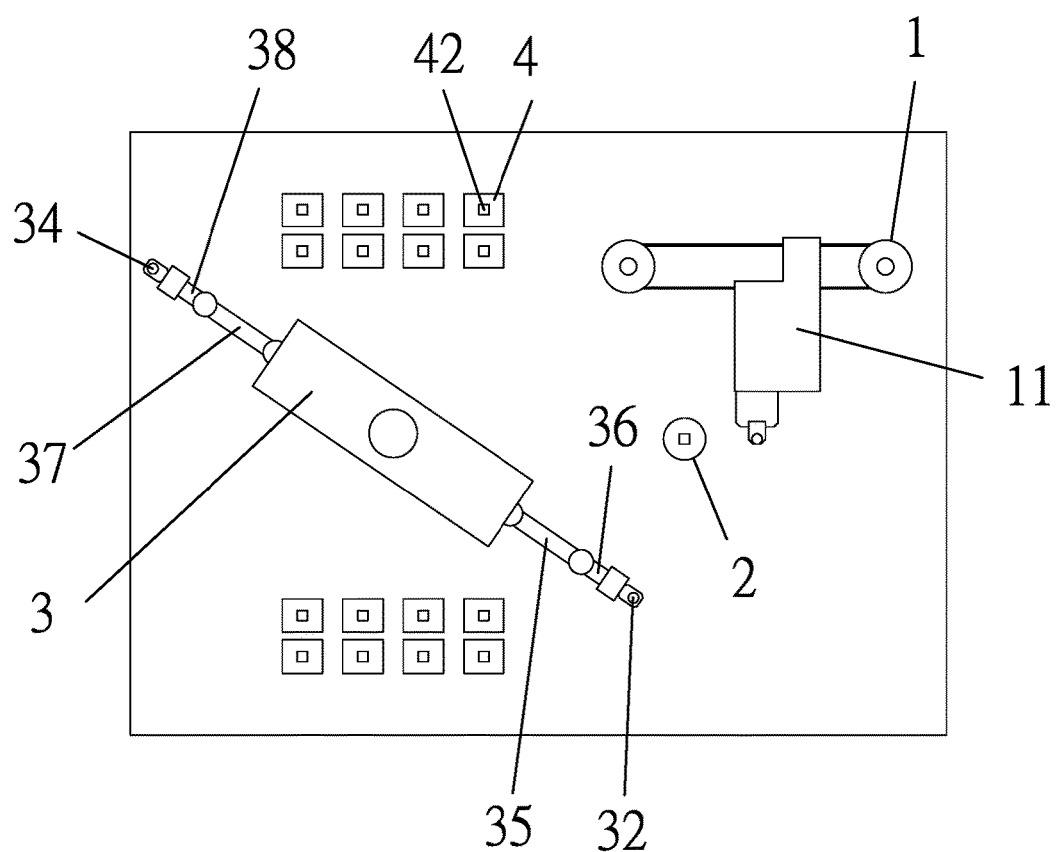
FIG. 9 is a schematic view illustrating a structure of a first rotary body and a second rotary body of the present invention.
Figure 10:
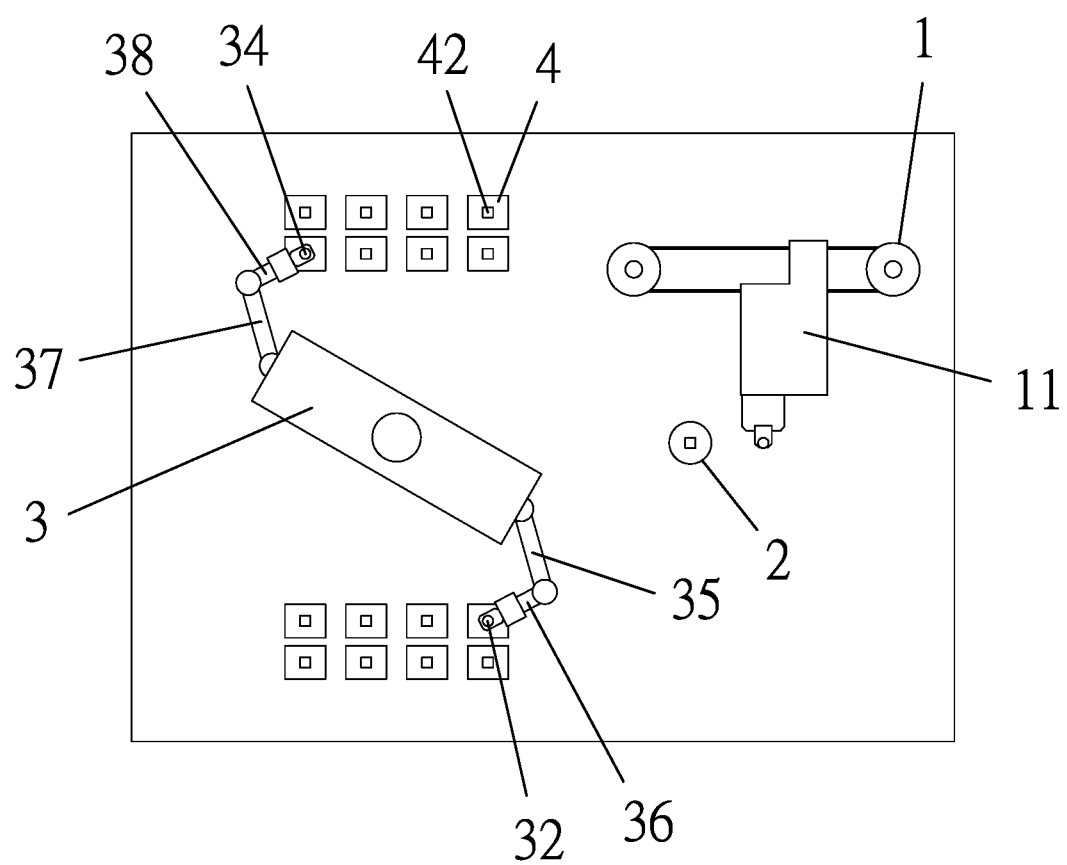
FIG. 10 is a schematic view illustrating operation of the first rotary body and the second rotary body of the present invention.

Referring to FIGS. 6 and 7, which are respectively a schematic view illustrating an embodiment of a test subject placing device of the present invention and a schematic view illustrating test of a MEMS non-inertial element according to the present invention, as shown in the drawings, the rotation device 3 is further provided, at a central position, with a test subject placing device 6. The test subject placing device 6 is set at a location that is higher than or lower than the rotation device 3. Further, the test subject placing device 6 has an end to which a placing component 61 is mounted and coupling to a test component 7 is made through the placing component 61 so that to test an MEMS non-inertial component (such as a micro type microphone or a micro type projector), the first feeding component 32 or the second feeding component 34 is operable to convey the non-inertial component into the operation stations 4 and then, the test subject placing device 6 is operable to rotatably move the test component 7 to a location above the operation stations 4 so that afterwards, the placing component 61 is allowed to set the test component 7 on and covering the non-inertial component to allow the test component 7 to conduct tests of pressure, humidity, temperature, or radio frequency and so on of the non-inertial component. For example, when the test component 7 is an extendible/retractable test component 7, the test component 7 may be set on and covering the non-inertial component to cover and close the operation sections 42 and then the test component 7 is compressed to generate different air pressure in order to conduct pressure tests for the non-inertial component. Further, a fixed operation station 4 may be provided for specifically testing the non-inertial component in order to provide an effect of effectively testing an MEMS non-inertial component.

Referring to FIGS. 7-10, which are respectively a schematic view illustrating leftward/rightward movement of a first feeding component and a second feeding component of the present invention, a schematic view illustrating a structure of a first rotary body and a second rotary body of the present invention, and a schematic view illustrating operation of the first rotary body and the second rotary body of the present invention, as shown in the drawings, the rotation device 3 has an end coupled to a first feeding component 32, and the rotation device 3 has an opposite end coupled to a second feeding component 34, so that through leftward/rightward movement conducted with the first feeding component 32 and the second feeding component 34, an un-burnt IC that is sucked and picked thereby can be positioned in a correct condition on the operation stations 4. Further, the rotation device 3 has an end that is also provided with a first rotary body 35, and an opposite end of the first rotary body 35 is rotatably coupled to the second rotary body 36, and an opposite end of the second rotary body 36 is coupled to the first feeding component 32. Further, the rotation device 3 has an opposite end that is provided with a third rotary body 37, and an opposite end of the third rotary body 37 is rotatably coupled to a fourth rotary body 38, and an opposite end of the fourth rotary body 38 is coupled to the second part feeding component 34. In this way, when each of the operation stations 4 is arranged or arrayed in a rectangular form or arranged or arrayed in other irregular configuration on a worktable, clockwise and/or counterclockwise rotation conducted with the rotation device 3 is insufficient to effectively move the first feeding component 32 or the second feeding component 34 to a location above and corresponding to each of the operation stations 4. In this way, in order to place an IC or an MEMS related component on the operation stations 4, moving the first feeding component 32 with the first rotary body 35 and the second rotary body 36 or moving the second feeding component 34 with the third rotary body 37 and the fourth rotary body 38 is necessary. This is similar to the condition when the first feeding component 32 retrieves an un-burnt IC or an MEMS related component from the loading section 2, the rotation device 3 is first operated to move the first feeding component 32 to a location adjacent to one of the operation stations 4 that is not in operation and then, the first rotary body 35 is operated to move the first feeding component 32 to a location above the operation stations 4, and finally, the second rotary body 36 is operated to conduct fine adjustment of the location of the first feeding component 32 to allow the first feeding component 32 to precisely and accurately place the un-burnt IC or the MEMS related component in the operation sections 42 to carry out a related operation. In this way, regardless how the operation stations 4 are arranged or arrayed, the first rotary body 35 and the second rotary body 36 or the third rotary body 37 and the fourth rotary body 38 can be operated to effectively move the first feeding component 32 or the second feeding component 34 to a location above each of the operation stations 4 to effectively carry out a burning operation of an IC or a test of an MEMS related component.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

We claim:

1. A length adjustable arm and micro-electro-mechanical system (MEMS) position detection equipment rotation test apparatus, comprising:
   a feeding section, wherein the feeding section comprises a feeding component that is operable to convey an un-burnt integrated circuit (IC) into a loading section;
   a rotation device, wherein the rotation device has one end coupled to a first feeding component, the first feeding component being operable for upward/downward/leftward/rightward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and
   a plurality of operation stations, wherein the operation stations are arranged on a circumferential area of and adjacent to the rotation device, the operation stations having a surface that is provided with an operation section, so that when the first part feeding component sucks and picks up the un-burnt IC located in the loading section, the rotation device moves the first part feeding component to a location adjacent to the operation stations, and then, the first rotary body and the second rotary body are operable to adjust the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

2. The length adjustable arm and MEMS position detection equipment rotation test apparatus according to claim 1, wherein the rotation device is further provided, on said one end thereof, with a first rotary body, the first rotary body having an opposite end rotatably coupled to a second rotary body, the second rotary body having an opposite end coupled to the first feeding component, and the rotation device comprises a drive source that comprises a hollow motor operatively coupled with a hollow type speed reducer.

3. The length adjustable arm and MEMS position detection equipment rotation test apparatus according to claim 2, wherein the rotation device has an opposite end that is provided with a third rotary body, the third rotary body having an opposite end rotatably coupled to a fourth rotary body, the fourth rotary body having an opposite end coupled to a second feeding component, the second feeding component being operable for upward/downward/leftward/rightward movement and rotary motion so that when the first feeding component carries out a feeding or part conveying operation, the second feeding component is operable to simultaneously carry out a feeding or out-feeding operation.

4. The length adjustable arm and MEMS position detection equipment rotation test apparatus according to claim 3, wherein the rotation device is provided, on a periphery thereof, with a waste zone to receive and hold an un-burnable IC or a damaged IC.

5. The length adjustable arm and MEMS position detection equipment rotation test apparatus according to claim 3, wherein the first feeding component and the second feeding component suck and pick up an IC through vacuum suction.

6. The length adjustable arm and MEMS position detection equipment rotation test apparatus according to claim 1, wherein the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

7. A length adjustable arm and micro-electro-mechanical system (MEMS) position detection equipment rotation test apparatus, comprising:
   a feeding section, wherein the feeding section comprises a feeding component that is operable to convey an un-burnt integrated circuit (IC) into a loading section;
   a rotation device, wherein the rotation device is provided therein with a first extendible section; the first extendible section is coupled to a first feeding component to control a frontward/rearward position of the first feeding component; the first feeding component is operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and
   a plurality of operation stations, wherein the operation stations are arranged on a circumferential area of and adjacent to the rotation device, the operation stations having a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

8. The length adjustable arm and MEMS position detection equipment rotation test apparatus according to claim 7, wherein the rotation device is provided therein with a second extendible section; the second extendible section is coupled to a second feeding component to control a frontward/rearward position of the second feeding component and the second feeding component is operable for upward/downward and rotary motion so that when the first feeding component carries out a feeding or part conveying operation, the second feeding component is operable to simultaneously carry out a feeding or out-feeding operation; and the rotation device comprises a drive source that comprises a hollow motor operatively coupled with a hollow type speed reducer.

9. The length adjustable arm and MEMS position detection equipment rotation test apparatus according to claim 8, wherein the first feeding component and the second feeding component suck and pick up an IC through vacuum suction, and the second extendible section is driven through belt driving, screw driving, or frog-arm driving.

10. The length adjustable arm and MEMS position detection equipment rotation test apparatus according to claim 7, wherein the first extendible section is driven through belt driving, screw driving, or frog-arm driving.

11. The length adjustable arm and MEMS position detection equipment rotation test apparatus according to claim 7, wherein the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

12. A length adjustable arm and micro-electro-mechanical system (MEMS) position detection equipment rotation test apparatus, comprising:
   a feeding section, wherein the feeding section comprises a feeding component that is operable to convey an un-burnt integrated circuit (IC) into a loading section;
   a rotation device, wherein the rotation device has one end coupled to a first feeding component, the first feeding component being operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and
   a plurality of operation stations, wherein the operation stations are arranged on a circumferential area of and adjacent to the rotation device; the operation stations are mounted on a rotation section; the rotation section is operable for rotation clockwise or counterclockwise in order to drive the operation stations to change positions thereof; and the operation stations have a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

13. The length adjustable arm and MEMS position detection equipment rotation test apparatus according to claim 12, wherein the rotation device has an opposite end that is coupled to a second feeding component, the second feeding component being operable for upward/downward movement and rotary motion so that when the first feeding component carries out a feeding or part conveying operation, the second feeding component is operable to simultaneously carry out a feeding or out-feeding operation.

14. The length adjustable arm and MEMS position detection equipment rotation test apparatus according to claim 13, wherein the first feeding component and the second feeding component suck and pick up an IC through vacuum suction.

15. The length adjustable arm and MEMS position detection equipment rotation test apparatus according to claim 12, wherein the rotation section is further operable for test of an MEMS inertial object or non-inertial object.

16. The length adjustable arm and MEMS position detection equipment rotation test apparatus according to claim 12, wherein the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

17. A length adjustable arm and micro-electro-mechanical system (MEMS) position detection equipment rotation test apparatus, comprising:
   a feeding section, wherein the feeding section comprises a feeding component that is operable to convey an un-burnt integrated circuit (IC) into a loading section;
   a rotation device, wherein the rotation device has one end coupled to a first feeding component, the first feeding component being operable for upward/downward movement and rotary motion so that when the first feeding component is moved to a location above the loading section, the first feeding component carries out an operation of downward movement to suck and pick up an un-burnt IC located in the loading section and then carries out an operation of upward movement to move the un-burnt IC; and
   a plurality of operation stations, wherein the operation stations are arranged on a circumferential area of and adjacent to the rotation device; the operation stations are provided on a periphery thereof with a turning section and the turning section is operable to drive the operation stations to conduct an operation of turning; and the operation stations have a surface that is provided with an operation section, so that when the first part feeding component sucks and picks up the un-burnt IC located in the loading section, the rotation device moves the first part feeding component to a location adjacent to the operation stations and determines if to drive the extendible section to conduct adjustment of the location of the first part feeding component in order to allow the un-burnt IC to be placed into the operation section for performance of a burning operation and after the burning operation of IC is completed, the first part feeding component is further operable to move the burnt IC from the operation section to an out-feeding section, wherein a process of feeding, burning, and out-feeding is cyclically and repeatedly performed.

18. The length adjustable arm and MEMS position detection equipment rotation test apparatus according to claim 17, wherein the rotation device has an opposite end that is coupled to a second feeding component, the second feeding component being operable for upward/downward movement and rotary motion so that when the first feeding component carries out a feeding or part conveying operation, the second feeding component is operable to simultaneously carry out a feeding or out-feeding operation; and the rotation device comprises a drive source that comprises a hollow motor operatively coupled with a hollow type speed reducer.

19. The length adjustable arm and MEMS position detection equipment rotation test apparatus according to claim 18, wherein the first feeding component and the second feeding component suck and pick up an IC through vacuum suction.

20. The length adjustable arm and MEMS position detection equipment rotation test apparatus according to claim 18, wherein the rotation device is further provided, at a central position, with a test subject placing device; the test subject placing device is set at a location that is higher than or lower than the rotation device; and the test subject placing device has an end to which a placing component is mounted and coupling to a test component is made through the placing component.

21. The length adjustable arm and MEMS position detection equipment rotation test apparatus according to claim 17, wherein the loading section is further provided with a holding component, wherein the holding component comprises a cavity, and the cavity corresponds to and receives and holds an IC to be burnt and to be tested to correct a posture of the IC to be burnt or to be tested and the holding component is operable to rotate in order to be aligned to various feeding directions.

\* \* \* \* \*